(12) United States Patent
Kim et al.

(10) Patent No.: US 10,859,907 B2
(45) Date of Patent: Dec. 8, 2020

(54) METHOD FOR PREPARING COLUMN SPACER

(71) Applicant: Rohm and Haas Electronic Materials Korea Ltd., Cheonan (KR)

(72) Inventors: Yeonok Kim, Hwaseong (KR); Seok-Bong Park, Yongin (KR); Gyung-Sik Choi, Hwaseong (KR); Su Min Lee, Hwaseong (KR)

(73) Assignee: Rohm and Haas Electronic Materials Korea Ltd, Seoul (KR)

( * ) Notice: Subject to any disclaimer, the term of this patent is extended or adjusted under 35 U.S.C. 154(b) by 100 days.

(21) Appl. No.: 15/774,426

(22) PCT Filed: Sep. 28, 2016

(86) PCT No.: PCT/KR2016/010851
§ 371 (c)(1),
(2) Date: May 8, 2018

(87) PCT Pub. No.: WO2017/086590
PCT Pub. Date: May 26, 2017

(65) Prior Publication Data
US 2018/0321535 A1    Nov. 8, 2018

(30) Foreign Application Priority Data

Nov. 19, 2015 (KR) .................. 10-2015-0162300
Sep. 23, 2016 (KR) .................. 10-2016-0121859

(51) Int. Cl.
*G03F 1/50*      (2012.01)
*G02F 1/1339*    (2006.01)

(52) U.S. Cl.
CPC ...... *G03F 1/50* (2013.01); *G02F 2001/13398* (2013.01)

(58) Field of Classification Search
CPC ........................................... G03F 1/50
USPC ............................................... 430/5
See application file for complete search history.

(56) References Cited

U.S. PATENT DOCUMENTS

| 7,153,614 B2 | 12/2006 | Imai et al. |
| 7,332,250 B2 | 2/2008 | Misaka |
| 2004/0265708 A1 | 12/2004 | Misaka |
| 2007/0087275 A1 | 4/2007 | Jang et al. |

FOREIGN PATENT DOCUMENTS

| JP | 2009058607 A | 3/2009 |
| JP | 2014-146029 A | 8/2014 |
| KR | 100787715 B1 | 12/2007 |
| KR | 10-2014-0052890 | 5/2014 |
| TW | 201439293 A | 10/2014 |

OTHER PUBLICATIONS

Search Report for Taiwan Patent Application No. 105134613; dated Oct. 26, 2016.

*Primary Examiner* — Christopher G Young
(74) *Attorney, Agent, or Firm* — S. Matthew Cairns

(57) ABSTRACT

The present invention relates to a method for preparing a column spacer, and is characterized in using a mask including first, second, and third patterns having different light transmittance. In addition, according to the method for preparing a column spacer of the present invention, a taper angle between a matrix part and a spacer part may increase during manufacturing a column spacer in which the matrix part and the spacer part are continuously connected, and critical dimension of the spacer part may decrease. Therefore, a column spacer with fine patterns may be simply and efficiently manufactured.

3 Claims, 4 Drawing Sheets

[Fig. 1]
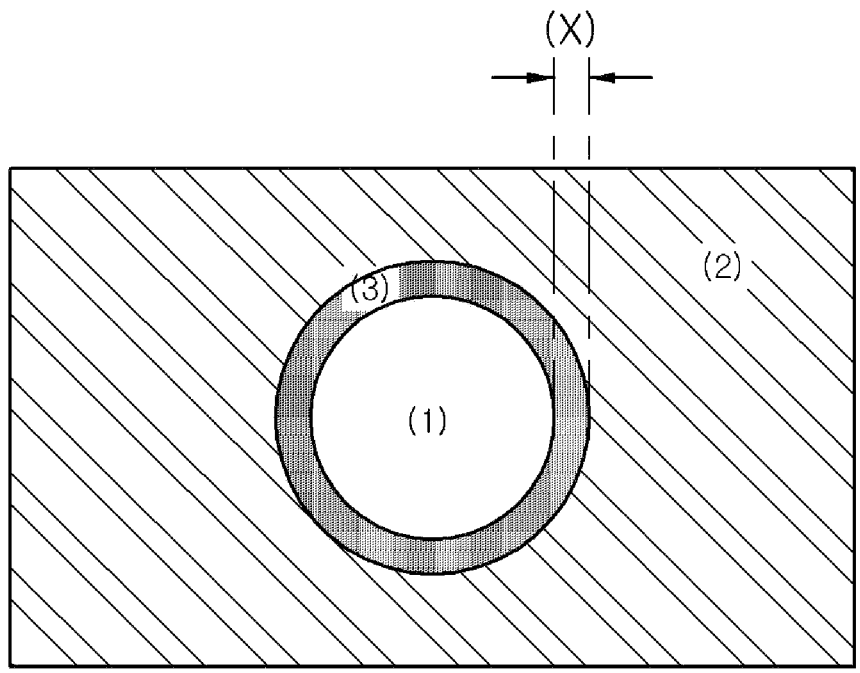
[Fig. 2]
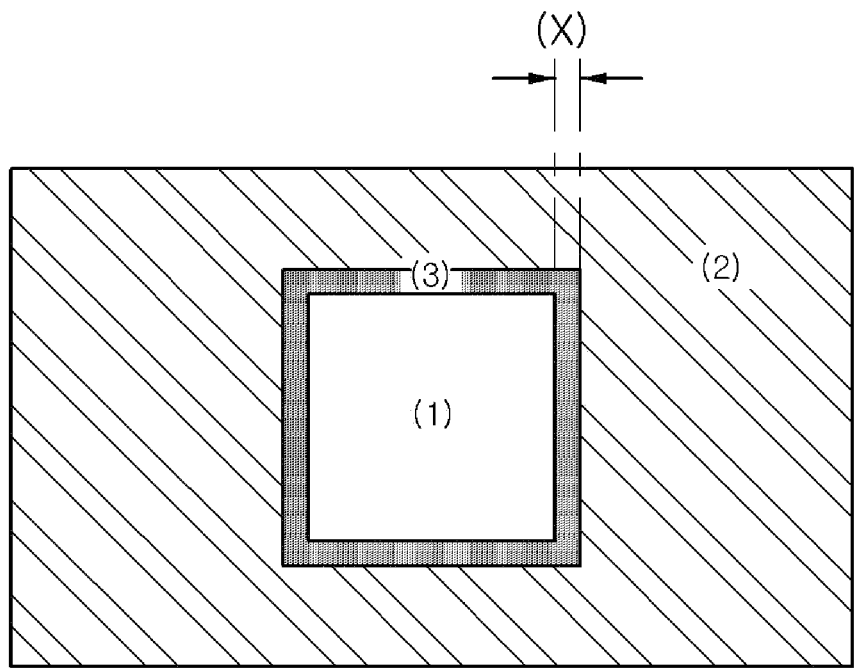

[Fig. 3]
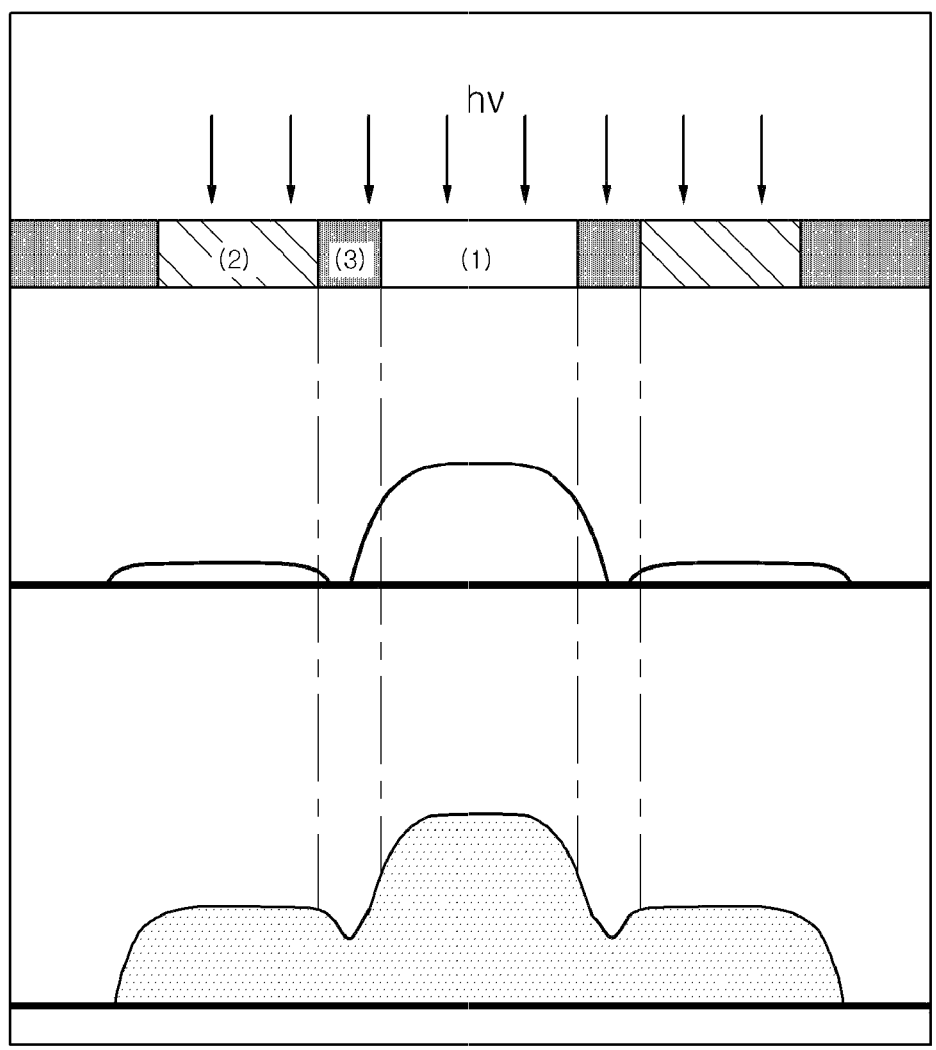

[Fig. 4]
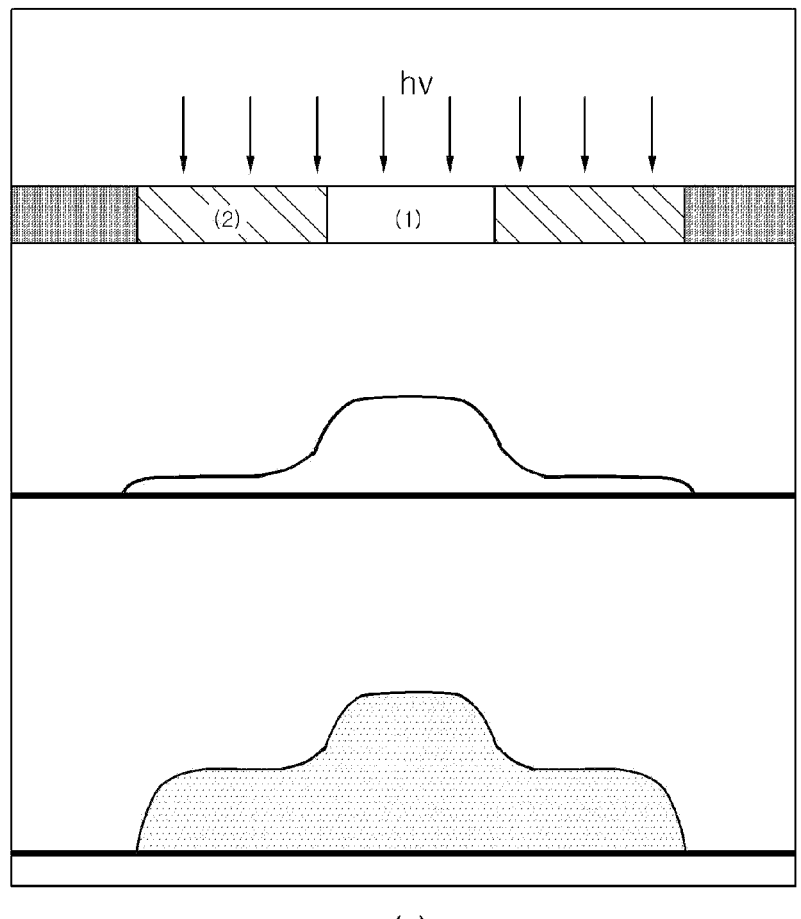
(a)
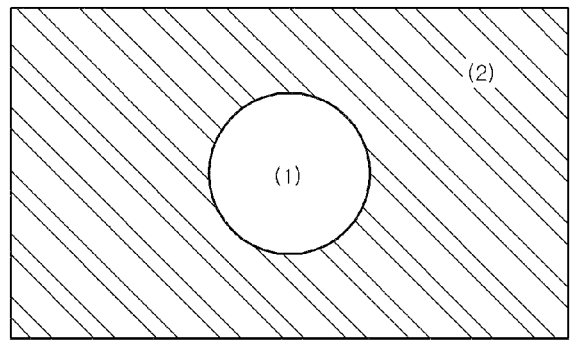
(b)

[Fig. 5]
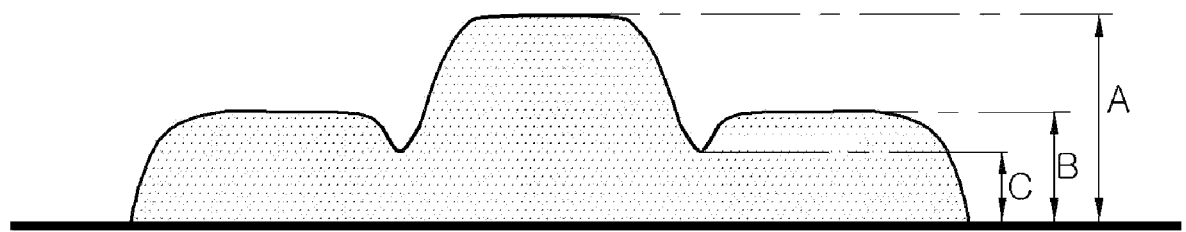

METHOD FOR PREPARING COLUMN SPACER

TECHNICAL FIELD

The present invention relates to a method for preparing a column spacer, by which fine patterns may be readily obtained through increasing a taper angle between a matrix part and a spacer part upon manufacturing a column spacer which includes continuously connected matrix part and spacer part, and by decreasing the critical dimension of the spacer part.

BACKGROUND ART

Recently, a spacer formed using a photosensitive resin composition is employed in a liquid crystal cell of a liquid crystal display (LCD) in order to constantly maintain a gap between upper and lower transparent substrates. An LCD is an electro-optic device driven by applying a voltage to a liquid crystal material injected into a constant gap between two transparent substrates, and thus it is very crucial to constantly maintain the gap between the two substrates. If the gaps between the transparent substrates are not constant, the voltage applied to a portion where the gaps are not constant and the transmittance of light passing through the portion may vary, resulting in defects of spatially non-uniform luminance. According to a recent demand for large LCD panels in size, it is even more crucial to constantly maintain a gap between two transparent substrates.

Recently, a method of using a mask having a full-tone pattern and a half-tone pattern is introduced for forming a column spacer having a height difference (Japanese Laid-open Patent No. 2009-58607). However, according to Japanese Laid-open Patent No. 2009-58607, the pattern profile of a cured film formed in correspondence to the boundary between the full-tone pattern and the half-tone pattern of the mask is not substantially sharp after post-baking, and it is difficult to achieve fine patterns.

In addition, efforts on using a light shielding material for a column spacer are conducted, and developments on a colored photosensitive resin composition are being actively conducted. Attempts have been made to simplify manufacturing processes by forming a black column spacer (light shielding spacer) in which a column spacer and a black matrix are integrated into one module by using a colored photosensitive resin composition. However, in the case a column spacer (black column spacer in which a column spacer and a black matrix are integrated into one module) having a height difference is manufactured using a colored photosensitive resin composition, the taper angle at the boundary of stepped portions having the height difference therebetween may become gentle due to the light shielding effect of a light shielding material, thereby causing an increase in the critical dimension of a spacer part.

DISCLOSURE OF INVENTION

Technical Problem

Accordingly, an object of the present invention is to provide a method of preparing a column spacer, by which the boundary between a matrix part and a spacer part is sharp and fine patterns are readily obtained upon forming a column spacer which includes continuously connected matrix part and spacer part.

Solution to Problem

According to one aspect of the present invention, there is provided a method of preparing a column spacer in which a matrix part and a spacer part protruded from the matrix part are integrally formed, comprising irradiating a coated film of a photosensitive resin composition with light using a mask having a pattern, and then performing development, wherein the mask comprises (1) a first pattern for forming the spacer part; (2) a second pattern for forming the matrix part, wherein the second pattern is positioned adjacent to the first pattern and has lower light transmittance than the first pattern; and (3) a third pattern positioned at the boundary between the first pattern and the second pattern, wherein the third pattern has lower light transmittance than the second pattern, and a valley recessed from the matrix part is formed at the boundary between the matrix part and the spacer part of the column spacer by the third pattern of the mask.

In addition, there is provided a mask for a column spacer comprising (1) a first pattern; (2) a second pattern positioned adjacent to the first pattern and having lower light transmittance than the first pattern; and (3) a third pattern positioned at the boundary between the first pattern and the second pattern and having lower light transmittance than the second pattern.

Advantageous Effects of Invention

According to the method of preparing a column spacer of the present invention, a taper angle between a matrix part and a spacer part may increase, and the critical dimension of the spacer part may decrease upon preparing a column spacer in which the matrix part and the spacer part are continuously connected, and thus, a column spacer with fine patterns may be simply and efficiently manufactured.

BRIEF DESCRIPTION OF DRAWINGS

FIGS. 1 and 2 each illustrates the pattern shape of a mask for a column spacer used in the preparation method of the present invention.

FIG. 3 is a schematic diagram showing a process of the present invention for preparing a column spacer by irradiating light using a mask.

FIG. 4 is a schematic process diagram according to Reference Example 1 ((a)), and a diagram showing a pattern shape of a mask used in Reference Example 1 ((b)).

FIG. 5 is a cross-sectional view of a black column spacer.

BEST MODE FOR CARRYING OUT THE INVENTION

Hereinafter, the present invention is explained in more detail.

Mask for Column Spacer

The present invention provides a mask for a column spacer comprising (1) a first pattern; (2) a second pattern positioned adjacent to the first pattern and having lower light transmittance than the first pattern; and (3) a third pattern positioned at the boundary between the first pattern and the second pattern and having lower light transmittance than the second pattern.

(1) First Pattern

The first pattern of the mask is for forming a spacer part in a column spacer and is correspondingly positioned at the spacer part which is to be formed during light irradiation.

The light transmittance of the first pattern may be 90 to 100%, 95 to 100%, or 98 to 100%.

The first pattern forms at least one closed region with respect to the whole area of a mask. Particularly, the first pattern may have a two-dimensional closed shape (1) as shown in FIGS. 1 and 2, and more particularly, may have a square, a triangle, a circle, or the like.

The area of the first pattern is not specifically limited, and the material of the first pattern may be any material as long as the first pattern has a desired light transmittance.

(2) Second Pattern

The second pattern of the mask is for forming a matrix part in a column spacer and is positioned adjacent to the first pattern, i.e., a corresponding position to the matrix part which is to be formed during light irradiation.

The light transmittance of the second pattern is smaller than the first pattern, and particularly, may be 15 to 25% of the light transmittance of the first pattern.

The area of the second pattern is not specifically limited and forms the remaining region of the first pattern and a third pattern which will be described below with respect to the whole area of the mask ((2) in FIGS. 1 and 2).

The material of the second pattern may be any material as long as the second pattern has a desired light transmittance.

(3) Third Pattern

The third pattern of the mask is a part for forming a valley recessed from the matrix part at the boundary between the matrix part and the spacer part of the column spacer, and is positioned at the boundary between the first pattern and the second pattern so that the third pattern corresponds to the boundary between the matrix part and the spacer part during light irradiation.

The third pattern has lower light transmittance than the second pattern and particularly, the light transmittance of the third pattern may be 0 to 25% of the light transmittance of the second pattern.

The third pattern forms a border region ((3) in FIGS. 1 and 2) surrounding the closed region of the first pattern with respect to the whole area of the mask, and the shape of the third pattern changes depending on the shape of the first pattern. Further, the third pattern may have a width ((X) in FIGS. 1 and 2) which is 14 to 60% of the width of the first pattern.

In the case where the third pattern has a spherical shape, the "width of the third pattern" is a halved value of a diameter difference between the third pattern and the first pattern (see FIG. 1), and in the case where the third pattern has a polygonal shape, the "width of the third pattern" is a halved value of a width difference between the third pattern and the first pattern (see FIG. 2).

The material of the third pattern may be any material which has a desired light transmittance.

Meanwhile, a method of forming a first pattern, a second pattern and a third pattern of the mask includes forming a metal film such as chrome, molybdenum silicide, tantalum, silicon, and nickel on a transparent substrate such as a quartz glass so as to obtain a semi-transparent film. In this case, the semi-transparent film may be formed by selecting a metal film having a certain transmittance, controlling the thickness of the metal film, or forming a metal film having fine patterns (line and space type, dot type, etc.) which have less resolution than the resolution limit of a stepper. In order to shield light, a metal film, a metal oxide film, a metal nitride film, or the like may be used.

The method for preparing a column spacer of the present invention comprises, irradiating a coated film of a photosensitive resin composition with light using a mask having a pattern and then performing development to form a column spacer in which a matrix part and a spacer part protruded from the matrix part are integrally formed, wherein the mask comprises (1) a first pattern for forming the spacer part; (2) a second pattern for forming the matrix part, wherein the second pattern is positioned adjacent to the first pattern and has lower light transmittance than the first pattern; and (3) a third pattern positioned at the boundary between the first pattern and the second pattern, wherein the third pattern has lower light transmittance than the second pattern, and a valley recessed from the matrix part is formed at the boundary between the matrix part and the spacer part of the column spacer by the third pattern of the mask.

The photosensitive resin composition includes (a) a copolymer, (b) a polymerizable compound, (c) a photopolymerization initiator, and (d) a colorant.

In the present description, "(meth)acryl" means "acryl" and/or "methacryl," and "(meth)acrylate" means "acrylate" and/or "methacrylate."

Hereinafter, the photosensitive resin composition will be explained in detail for each component.

(a) Copolymer

The copolymer used in the present invention may include (a-1) a structural unit derived from an ethylenically unsaturated carboxylic acid, an ethylenically unsaturated carboxylic anhydride or a combination thereof, and (a-2) a structural unit derived from an ethylenically unsaturated compound containing an aromatic ring, and may additionally include (a-3) a structural unit derived from an ethylenically unsaturated compound different from the structural units (a-1) and (a-2).

The copolymer may correspond to an alkali-soluble resin for achieving desired developability during the development step and may function as both of a basic support for forming a film after coating and a structure for final patterns.

(a-1) Structural Unit Derived from an Ethylenically Unsaturated Carboxylic Acid, an Ethylenically Unsaturated Carboxylic Anhydride, or a Combination Thereof In the present invention, the structural unit (a-1) is derived from an ethylenically unsaturated carboxylic acid, an ethylenically unsaturated carboxylic anhydride, or a combination thereof. The ethylenically unsaturated carboxylic acid or the ethylenically unsaturated carboxylic anhydride is a polymerizable unsaturated monomer containing at least one carboxyl group in a molecule. Preferable examples thereof may include an unsaturated monocarboxylic acid such as (meth)acrylic acid, crotonic acid, alpha-chloroacrylic acid, and cinnamic acid; an unsaturated dicarboxylic acid and an anhydride thereof such as maleic acid, maleic anhydride, fumaric acid, itaconic acid, itaconic anhydride, citraconic acid, citraconic anhydride, and mesaconic acid; an unsaturated polycarboxylic acid of trivalence or more and an anhydride thereof; and a mono[(meth)acryloyloxyalkyl] ester of a polycarboxylic acid of divalence or more such as mono[2-(meth)acryloyloxyethyl] succinate, mono[2-(meth)acryloyloxyethyl] phthalate, or the like. The structural unit derived from the above compounds may be included alone or in combination of two or more in the copolymer.

The amount of the structural unit (a-1) may be 5 to 65 mole %, and preferably 10 to 50 mole % based on the total number of moles of the structural units constituting the copolymer. Within this amount range, the developability may be good.

(a-2) Structural Unit Derived from an Ethylenically Unsaturated Compound Containing an Aromatic Ring The structural unit (a-2) is derived from an ethylenically unsaturated compound containing an aromatic ring, and preferable examples of the ethylenically unsaturated compound containing an aromatic ring may include phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tribromophenyl (meth)acrylate; styrene; styrene having an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; styrene having halogen such as fluorostyrene, chlorostyrene, bromostyrene, and iodostyrene; styrene having an alkoxy substituent such as methoxystyrene, ethoxystyrene, and propoxystyrene; 4-hydroxystyrene, p-hydroxy-α-methylstyrene, acetylstyrene; vinyltoluene, divinylbenzene, vinylphenol, o-vinylbenzyl methyl ether, m-vinylbenzyl methyl ether, p-vinylbenzyl methyl ether, o-vinylbenzyl glycidyl ether, m-vinylbenzyl glycidyl ether, p-vinylbenzyl glycidyl ether, or the like.

The structural unit derived from the above exemplified compounds may be included alone or in combination of two or more in the copolymer.

Among the compounds, the styrene compounds may be preferably used in consideration of polymerization properties.

The amount of the structural unit (a-2) may be 2 to 70 mole %, and preferably 5 to 60 mole % based on the total number of moles of the structural units constituting the copolymer. Within this amount range, favorable chemical resistance may be attained.

(a-3) Structural Unit Derived from an Ethylenically Unsaturated Compound Different from the Structural Units (a-1) and (a-2)

The copolymer used in the present invention may additionally include a structural unit derived from an ethylenically unsaturated compound different from the structural units (a-1) and (a-2) in addition to the structural units (a-1) and (a-2).

The ethylenically unsaturated compound different from the structural units (a-1) and (a-2) may include an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly(ethylene glycol) methyl ether (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine containing an N-vinyl group such as N-vinyl pyrrolidone, N-vinyl carbazole and N-vinyl morpholine; an unsaturated ether such as vinyl methyl ether and vinyl ethyl ether; an ethylenically unsaturated compound containing an epoxy group such as glycidyl (meth)acrylate, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, 4-hydroxybutyl (meth)acrylate glycidyl ether, allyl glycidyl ether, and 2-methylallyl glycidyl ether; an unsaturated imide such as N-phenylmaleimide, N-(4-chlorophenyl)maleimide, N-(4-hydroxyphenyl)maleimide and N-cyclohexylmaleimide, or the like.

The structural unit derived from the above exemplified compounds may be included alone or in combination of two or more in the copolymer.

Preferably, the structural unit derived from the ethylenically unsaturated compound containing an epoxy group and/or the unsaturated imide may be used, and more preferably, glycidyl (meth)acrylate, 4-hydroxybutyl (meth)acrylate glycidyl ether, and/or a structural unit derived from N-substituted maleimide may be used in consideration of the improvement of copolymerization properties and the strength of an insulating film.

The amount of the structural unit (a-3) may be 10 to 80 mole %, and preferably 20 to 75 mole % based on the total number of moles of the structural units constituting the copolymer. Within this amount range, the storage stability of the photosensitive resin composition may be maintained and the retention rate thereof may be improved.

The copolymer having the structural units (a-1) to (a-3) may include a copolymer of (meth)acrylic acid/styrene, a copolymer of (meth)acrylic acid/benzyl (meth)acrylate, a copolymer of (meth)acrylic acid/styrene/methyl (meth)acrylate, a copolymer of (meth)acrylic acid/styrene/methyl (meth)acrylate/glycidyl (meth)acrylate, a copolymer of (meth)acrylic acid/styrene/methyl (meth)acrylate/glycidyl (meth)acrylate/N-phenylmaleimide, a copolymer of (meth)acrylic acid/styrene/methyl (meth)acrylate/glycidyl (meth)acrylate/N-cyclohexylmaleimide, a copolymer of (meth)acrylic acid/styrene/n-butyl (meth)acrylate/glycidyl (meth)acrylate/N-phenylmaleimide, a copolymer of (meth)acrylic acid/styrene/glycidyl (meth)acrylate/N-phenylmaleimide, a copolymer of (meth)acrylic acid/styrene/4-hydroxybutyl (meth)acrylate glycidyl ether/N-phenylmaleimide, or the like.

One or more copolymers may be included in the photosensitive resin composition.

The weight average molecular weight (Mw) of the copolymer may be in the range of 3,000 to 50,000, and preferably 5,000 to 40,000, when determined by gel permeation chromatography (eluent: tetrahydrofuran) referenced to polystyrene. Within this range, the composition may have improved adhesiveness to a substrate, physical/chemical properties and viscosity.

The copolymer in the total photosensitive resin composition may be used in an amount of 0.5 to 60 wt %, and preferably 5 to 50 wt % based on the total weight of the solid content of the photosensitive resin composition (i.e., weight excluding solvents). Within this range, the composition would produce a film having a good pattern profile after development with improved properties such as chemical resistance.

The copolymer may be prepared by injecting a molecular weight regulator, a radical polymerization initiator, a solvent, and the structural units (a-1) to (a-3), charging nitrogen, and stirring slowly for polymerizing.

The molecular weight regulator may be a mercaptan compound such as butyl mercaptan and octyl mercaptan, or an α-methylstyrene dimer, but is not limited thereto.

The radical polymerization initiator may be an azo compound such as 2,2'-azobisisobutyronitrile, 2,2'-azobis(2,4-dimethylvaleronitrile), and 2,2'-azobis(4-methoxy-2,4-dimethylvaleronitrile), benzoyl peroxide, lauryl peroxide, t-butyl peroxypivalate, 1,1-bis(t-butylperoxy)cyclohexane, or the like, but is not limited thereto. The radical polymerization initiator may be used alone or as a mixture of two or more.

Also, the solvent may be any conventional solvent commonly used in the preparation of a copolymer and may include, e.g., propylene glycol monomethyl ether acetate (PGMEA).

(b) Polymerizable Compound

The polymerizable compound used in the present invention may be any compound that may be polymerized by the action of a polymerization initiator, and may be a polyfunctional monomer, oligomer or polymer commonly used in a photosensitive resin composition.

More preferably, the polymerizable compound may include a monofunctional or polyfunctional ester compound of acrylic acid or methacrylic acid having at least one ethylenically unsaturated double bond, and may preferably include a polyfunctional compound having at least two functional groups in consideration of chemical resistance.

The polymerizable compound may be selected from the group consisting of ethylene glycol di(meth)acrylate, propylene glycol di(meth)acrylate, diethylene glycol di(meth)acrylate, triethylene glycol di(meth)acrylate, 1,6-hexanediol di(meth)acrylate, polyethylene glycol di(meth)acrylate, polypropylene glycol di(meth)acrylate, glycerin tri(meth)acrylate, trimethylolpropane tri(meth)acrylate, pentaerythritol tri(meth)acrylate, a monoester of pentaerythritol tri(meth)acrylate and succinic acid, pentaerythritol tetra(meth)acrylate, dipentaerythritol penta(meth)acrylate, dipentaerythritol hexa(meth)acrylate, a monoester of dipentaerythritol penta(meth)acrylate and succinic acid, caprolactone modified dipentaerythritol hexa(meth)acrylate, pentaerythritol triacrylate hexamethylene diisocyanate (a reaction product of pentaerythritol triacrylate and hexamethylene diisocyanate), tripentaerythritol hepta(meth)acrylate, tripentaerythritol octa(meth)acrylate, bisphenol A epoxyacrylate, and ethylene glycol monomethyl ether acrylate, and a mixture thereof, but is not limited thereto.

The amount of the polymerizable compound may be 1 to 60 wt %, and preferably 5 to 45 wt % based on the total solid content of the photosensitive resin composition (i.e., weight excluding solvents). Within this range, a pattern may be readily formed, and defects of a pattern profile such as scum at a terminal part during development may not be generated.

(c) Photopolymerization Initiator

The photopolymerization initiator used in the present invention may be any known photopolymerization initiator.

The photopolymerization initiator may be selected from the group consisting of an acetophenone compound, a non-imidazole compound, a triazine compound, an onium compound, a benzoin compound, a benzophenone compound, a diketone compound, an α-diketone compound, a polynuclear quinone compound, a thioxanthone compound, a diazo compound, an imidesulfonate compound, an oxime compound, a carbazole compound, a sulfonium borate compound, and a mixture thereof.

Preferred for high sensitivity are one or more oxime compounds disclosed in Korean Laid-open Patent Nos. 2004-0007700, 2005-0084149, 2008-0083650, 2008-0080208, 2007-0044062, 2007-0091110, 2007-0044753, 2009-0009991, 2009-0093933, 2010-0097658, 2011-0059525, 2011-0091742, 2011-0026467, and 2011-0015683, PCT Laid-open Patent Nos. WO 2010/102502 and WO 2010/133077.

Particular examples of commercially available photopolymerization initiators include OXE-01 (BASF), OXE-02 (BASF), OXE-03 (BASF), N-1919 (ADEKA), NCI-930 (ADEKA), NCI-831 (ADEKA), or the like The photopolymerization initiator may be included in an amount of 0.01 to 15 wt %, and preferably 0.1 to 10 wt % based on the total solid content of the photosensitive resin composition (i.e., weight excluding solvents). Within this range, the resin may be sufficiently cured by exposure, a column spacer having good elasticity recovery rate may be manufactured.

(d) Colorant

A colorant is contained in the photosensitive resin composition of the present invention to impart light shielding properties.

The colorant used in the present invention may be a mixture of two or more of an inorganic or organic colorant, and preferably a colorant having high chromogenic properties and heat resistance. Particularly, the use of a mixture of two or more organic colorants may be favorable for preventing light leakage through a black matrix and for securing transmittance for mask alignment.

In addition, the colorant may include a black colorant and a blue colorant. The black colorant may be a black inorganic colorant and/or a black organic colorant.

According to one embodiment, the photosensitive resin composition may include a black organic colorant as a colorant; and optionally, may further include a black inorganic colorant and a blue colorant.

Any black inorganic colorant, any black organic colorant, and any blue colorant known in the art may be used, e.g., compounds classified as a pigment in the Color Index (printed by The Society of Dyers and Colourists), and any dye known in the art may be used.

Particular examples of the black inorganic colorant may include carbon black, titanium black, a metal oxide such as Cu—Fe—Mn-based oxide and synthetic iron black, or the like. Preferred among them is carbon black for desirable pattern properties and chemical resistance.

In addition, particular examples of the black organic colorant may include aniline black, lactam black, perylene black, or the like. Preferred among them is lactam black (e.g., Black 582 of BASF Co.) for desirable optical density, permittivity, transmittance, or the like.

Particular examples of the blue colorant may include C.I. Pigment Blue 15:6, C.I. Pigment Blue 15:4, C.I. Pigment Blue 60, C.I. Pigment Blue 16, or the like. Preferred among them is C.I. Pigment Blue 15:6 for preventing light leakage.

The amount of the black inorganic colorant, the black organic colorant, and the blue colorant may be 0 to 20 wt %, 10 to 40 wt %, and 0 to 15 wt %, preferably greater than 0 wt % to less than 10 wt %, 10 to 40 wt %, and 1 to 15 wt % based on the total weight of the photosensitive resin composition on the basis of the solid content excluding solvents. Within the range, the resin composition may have a high optical density for preventing light leakage and attaining transmittance necessary for mask alignment.

Meanwhile, a dispersing agent may be used for dispersing the colorant in the photosensitive resin composition of the present invention. Examples of the dispersing agent may include any known dispersing agent for a colorant. Particular examples may include a cationic surfactant, an anionic surfactant, a non-ionic surfactant, a zwitterionic surfactant, a silicon surfactant, a fluorine surfactant, or the like. Commercially available dispersing agent may include Disperbyk-182, -183, -184, -185, -2000, -2150, -2155, -2163 or -2164 manufactured by BYK Co. These compounds may be used alone or in combination of two or more thereof. The dispersing agent may be added in advance to the colorant The weight average molecular weight (Mw) of the epoxy resin compound may be in the range of 400 to 10,000 when determined by gel permeation chromatography referenced to polystyrene.

For example, the epoxy resin compound may be an epoxy resin compound having a cardo backbone structure, and preferably, an epoxy resin compound having a cardo backbone structure represented by the following Formula 1.

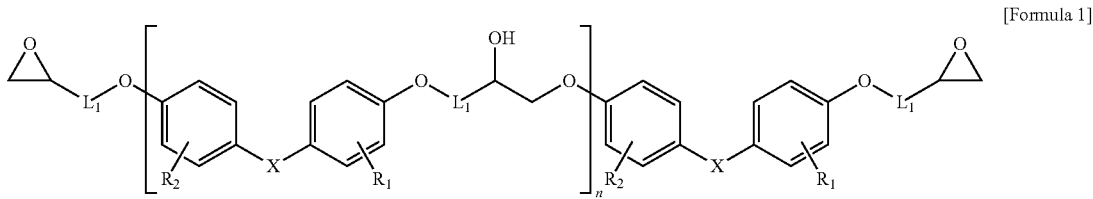

[Formula 1]

through surface treatment of the colorant therewith, or added together with the colorant during the preparation of a photosensitive resin composition.

Alternatively, the colorant may be mixed with a binder and used for the preparation of a photosensitive resin composition. In this case, the binder may be the copolymer (a) described in the present invention, a known copolymer, or a mixture thereof.

Thus, the colorant used in the present invention may be added to the photosensitive resin composition in the form of a colored dispersion (i.e., colored mill base) obtained by mixing the colorant with a dispersing agent, a binder, a solvent, or the like.

(e) Surfactant

The photosensitive resin composition of the present invention may further include a surfactant to improve coatability and to prevent the generation of defects.

Although the kind of the surfactant is not particularly limited, for example, a fluorine (F) surfactant or silicon (Si) surfactant may be used.

The commercially available silicon surfactant may include DC3PA, DC7PA, SH11PA, SH21PA, and SH8400 manufactured by Dowcorning Toray Silicon Co., TSF-4440, TSF-4300, TSF-4445, TSF-4446, TSF-4460, and TSF-4452 manufactured by GE Toshiba Silicones Co., BYK 333, BYK 307, BYK 3560, BYK UV 3535, BYK 361N, BYK 354, and BYK 399 manufactured by BYK Co., or the like. The surfactant may be used alone or in combination of two or more thereof. The commercially available fluorine surfactant may include Megaface F-470, F-471, F-475, F-482, F-489, F-563, and RS-55 manufactured by DIC (Dainippon Ink Kagaku Kogyo Co.). Among them, used as the surfactant can be preferably BYK 333 and BYK 307 manufactured by BYK Co., and Megaface F-563 and RS-55 manufactured by DIC.

The amount of the surfactant may be 0.001 to 10 wt %, and preferably 0.05 to 5 wt % based on the total solid content of the photosensitive resin composition. Within this range, the photosensitive resin composition may be readily coated.

(f) Epoxy Resin Compound or a Compound Derived Therefrom

The photosensitive resin composition of the present invention may additionally include an epoxy resin compound or a compound derived therefrom.

In Formula 1,

X is each independently

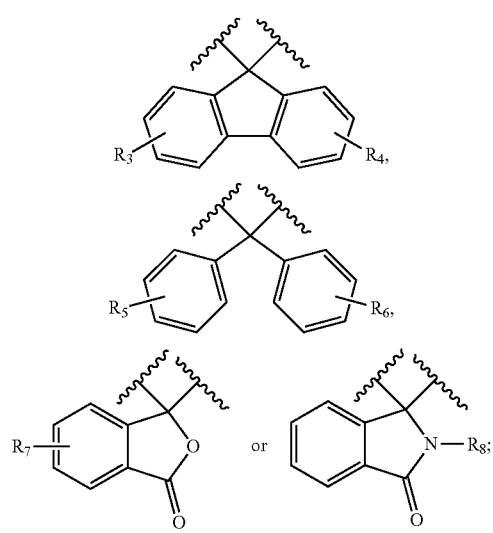

$L^1$ is each independently a $C_{1-10}$ alkylene group, a $C_{3-20}$ cycloalkylene group, or a $C_{1-10}$ alkyleneoxy group;

$R_1$ to $R_7$ are each independently H, a $C_{1-10}$ alkyl group, a $C_{1-10}$ alkoxy group, a $C_{2-10}$ alkenyl group, or a $C_{6-14}$ aryl group;

$R_8$ is H, methyl, ethyl, $CH_3CHCl$—, $CH_3CHOH$—, $CH_2$=$CHCH_2$—, or phenyl; and n is an integer from 0 to 10.

Preferable examples of the $C_{1-10}$ alkylene group may include methylene, ethylene, propylene, isopropylene, butylene, isobutylene, sec-butylene, t-butylene, pentylene, isopentylene, t-pentylene, hexylene, heptylene, octylene, isooctylene, t-octylene, 2-ethylhexylene, nonylene, isononylene, decylene, isodecylene, or the like.

Preferable examples of the $C_{3-20}$ cycloalkylene group may include cyclopropylene, cyclobutylene, cyclopentylene, cyclohexylene, cycloheptylene, decalinylene, adamantylene, or the like.

Preferable examples of the $C_{1-10}$ alkyleneoxy group may include methyleneoxy, ethyleneoxy, propyleneoxy, butyleneoxy, sec-butyleneoxy, t-butyleneoxy, pentyleneoxy, hexyleneoxy, heptyleneoxy, octyleneoxy, 2-ethyl-hexyleneoxy, or the like.

Preferable examples of the $C_{1-10}$ alkyl group may include methyl, ethyl, propyl, isopropyl, butyl, isobutyl, sec-butyl, t-butyl, pentyl, isopentyl, t-pentyl, hexyl, heptyl, octyl, isooctyl, t-octyl, 2-ethylhexyl, nonyl, isononyl, decyl, isodecyl, or the like.

Preferable examples of the $C_{1-10}$ alkoxy group may include methoxy, ethoxy, propoxy, butyloxy, sec-butoxy, t-butoxy, pentoxy, hexyloxy, heptoxy, octyloxy, 2-ethyl-hexyloxy, or the like.

Preferable examples of the $C_{2-10}$ alkenyl group may include vinyl, allyl, butenyl, propenyl, or the like.

Preferable examples of the $C_{6-14}$ aryl group may include phenyl, tolyl, xylyl, naphthyl, or the like.

In a preferred example, the epoxy resin compound having the cardo backbone structure may be prepared through the synthesis route of below:

[Reaction Scheme 1]

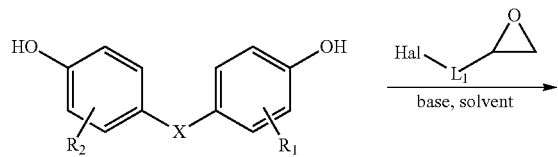

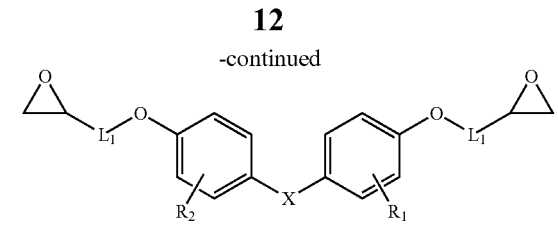

In Reaction Scheme 1,
Hal is halogen; and
X, $R_1$, $R_2$ and $L_1$ are the same as defined in Formula 1.

The compound derived from the epoxy resin compound having the cardo backbone structure may be obtained by reacting the epoxy resin compound having the cardo backbone structure with an unsaturated basic acid to produce an epoxy adduct and then reacting the epoxy adduct thus obtained with a polybasic acid anhydride, or by further reacting the product thus obtained with a monofunctional or polyfunctional epoxy compound.

Any unsaturated basic acid known in the art, e.g., acrylic acid, methacrylic acid, crotonic acid, cinnamic acid, sorbic acid, or the like, may be used.

Any polybasic acid anhydride known in the art, e.g., succinic anhydride, maleic anhydride, trimellitic anhydride, pyromellitic anhydride, 1,2,4,5-cyclohexane tetracarboxylic dianhydride, hexahydrophthalic anhydride, or the like, may be used.

Any monofunctional or polyfunctional epoxy compound known in the art, e.g., glycidyl methacrylate, methyl glycidyl ether, ethyl glycidyl ether, propyl glycidyl ether, isopropyl glycidyl ether, butyl glycidyl ether, isobutyl glycidyl ether, bisphenol Z glycidyl ether, or the like, may be used.

In a preferred example, the compound derived from the epoxy resin compound having the cardo backbone structure may be prepared through the synthesis route of below:

[Reaction Scheme 2]

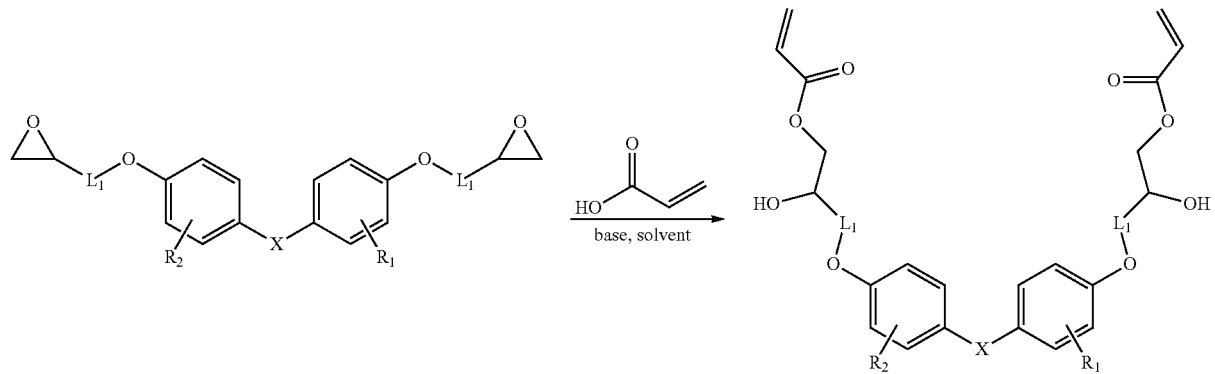

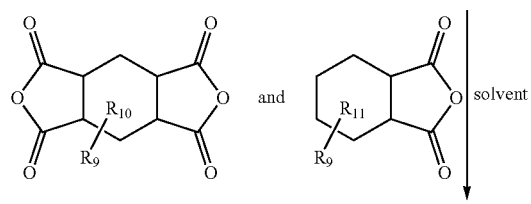

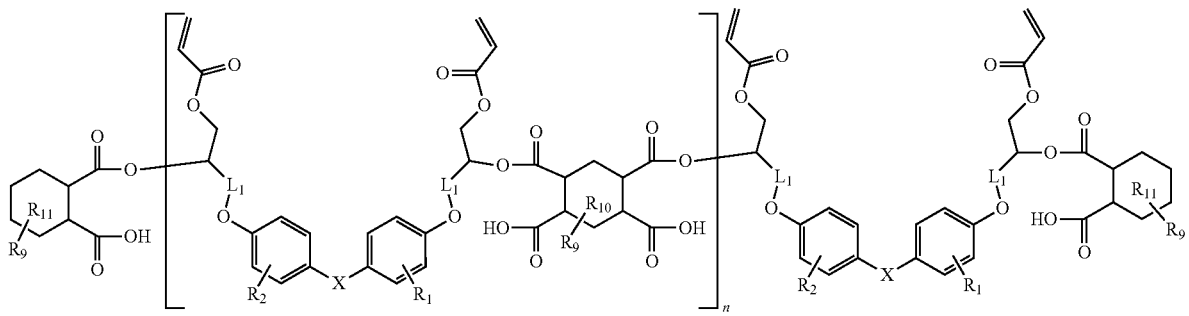

In Reaction Scheme 2, $R_9$ is each independently H, a $C_{1-10}$ alkyl group, a $C_{1-10}$ alkoxy group, a $C_{2-10}$ alkenyl group, or a $C_{6-14}$ aryl group;

$R_{10}$ and $R_{11}$ are each independently a saturated or unsaturated $C_6$ aliphatic ring, or a benzene ring;

n is an integer from 1 to 10; and

X, $R_1$, $R_2$ and $L_1$ are the same as defined in Formula 1.

When the epoxy resin compound having the cardo backbone structure or the compound derived therefrom is used, the cardo backbone structure may improve the adhesiveness of a cured material to a substrate, alkaline resistance, processability, strength, and the like. Further, an image having a fine resolution may be formed in a pattern once an uncured part is removed upon development.

The amount of the epoxy resin compound or the compound derived therefrom may be 1 to 70 wt %, and preferably 5 to 50 wt % based on the total amount of the solid content of the photosensitive resin composition (i.e., weight excluding solvents). Within the range, the resolution and chemical resistance may be improved. Further, the pattern profile may be maintained well, and a constant height difference between patterns with a desired margin width (i.e., allowable width) may be favorably obtained.

(g) Solvent

The photosensitive resin composition of the present invention may preferably be prepared as a liquid composition by mixing the above components with a solvent. Any solvent known in the art, which is compatible but not reactive with the components in the photosensitive resin composition may be used.

Examples of the solvent may include glycol ethers such as ethylene glycol monoethyl ether; ethylene glycol alkyl ether acetates such as ethyl cellosolve acetate; esters such as ethyl 2-hydroxypropionate; diethylene glycols such as diethylene glycol monomethyl ether; propylene glycol alkyl ether acetates such as propylene glycol monomethyl ether acetate, and propylene glycol propyl ether acetate; and alkoxyalkyl acetates such as 3-methoxybutyl acetate. The solvent may be used alone or in combination of two or more thereof.

The amount of the solvent is not specifically limited, but may be determined so that the solid concentration of the composition excluding the solvents may be commonly 5 to 70 wt %, and preferably 10 to 55 wt %, for coatability and stability of a photosensitive resin composition finally obtained.

(h) Silane Coupling Agent

The photosensitive resin composition of the present invention may further include a silane coupling agent having a reactive substituent selected from the group consisting of carboxyl, (meth)acryloyl, isocyanate, amino, mercapto, vinyl, epoxy, and a combination thereof to improve adhesiveness to a substrate, if desired.

The kind of the silane coupling agent is not limited, but may preferably be selected from the group consisting of trimethoxysilyl benzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane, γ-glycidoxypropyltriethoxysilane, β-(3,4-epoxycyclohexyDethyltrimethoxysilane, phenylaminotrimethoxysilane, and a mixture thereof. Preferred among them is γ-isocyanatopropyltriethoxysilane having an isocyanate group (e.g., KBE-9007 manufactured by Shin-Etsu Co.) or phenylaminotrimethoxysilane, which has good chemical resistance and good adhesiveness to a substrate.

The amount of the silane coupling agent may be 0.01 to 10 wt %, and preferably 0.05 to 5 wt % based on the total solid content of the photosensitive resin composition (i.e., weight excluding solvents). Within the range, the photosensitive resin composition may have improved adhesiveness.

Further, other additives such as an antioxidant and a stabilizer may be included as long as the physical properties of the photosensitive resin composition are not adversely affected.

The photosensitive resin composition of the present invention including the above-described components may be prepared by a common method, for example, by the following method.

The colorant is mixed with a solvent in advance and is dispersed using a bead mill until the average particle diameter of the colorant becomes a desired degree. In this case, a surfactant may be used, or a portion or the whole of a copolymer may be mixed. To the dispersant thus obtained, the remainder of the copolymer and the surfactant, an epoxy resin compound or a compound derived therefrom, a polymerizable compound, and a photopolymerization initiator are added, and an additive such as a silane coupling agent or an additional solvent is further mixed thereto at a certain concentration, followed by sufficiently stirring them to obtain a desired photosensitive resin composition.

The desired column spacer may be manufactured using the photosensitive resin composition thus obtained and by performing a forming step of a coated film, an exposing step, a developing step, and a heating step. The column spacer of the present invention may be a black column spacer in which a column spacer and a black matrix are integrally formed.

First, in the step of forming a coated film, the photosensitive resin composition is coated on a substrate which is pre-treated, by a spin coating method, a slit coating method, a roll coating method, a screen printing method, an applicator method, or the like to a desired thickness, for example 2 to 25 µm, and then pre-baked at a temperature of 70 to 100° C. for 1 to 10 minutes to remove solvents and to form a coated film.

Then, in order to form a pattern in the coated film, a mask for a column spacer (see FIGS. 1 and 2) is disposed and activated ray is irradiated as shown in FIG. 3. The activated ray may have a wavelength of 200 to 500 nm, and as a light source used for the irradiation, a low pressure mercury lamp, a high pressure mercury lamp, an extra high pressure mercury lamp, a metal halide lamp, an argon gas laser, or the like may be used; and X-ray, electronic ray, or the like may also be used, if desired. The exposure intensity may vary depending on the kind and the compositional ratio of the components of the composition and the thickness of a dried layer. When a high pressure mercury lamp is used, the exposure density may be 500 mJ/cm$^2$ or less (with a wavelength of 365 nm).

After the exposing step, a developing step using an aqueous alkaline solution such as sodium carbonate, sodium hydroxide, potassium hydroxide, tetramethylammonium hydroxide, etc., is performed to dissolve and remove unnecessary portions, thereby remaining only an exposed portion to form a pattern.

According to the present invention, a spacer part (column spacer region) corresponding to the first pattern of the mask may be formed, a matrix part (black matrix region) corresponding to the second pattern of the mask may be formed, and a valley (light shielding region) recessed from the matrix part, corresponding to the third pattern of the mask may be formed at the boundary between the matrix part and the spacer part.

Lastly, an image pattern obtained by the development is cooled to room temperature and post-baked in a hot air convention type drying furnace at 180 to 250° C. for 10 to 60 minutes, which is a heat treatment step, thereby obtaining a column spacer (black column spacer, i.e., light shielding spacer) having a desired shape.

Since the column spacer thus formed has a large taper angle between a matrix part and a spacer part and has small critical dimension of the spacer part, fine patterns may be obtained, and thus, may be used in the manufacture of electronic parts of an LCD, an OLED display, etc. Accordingly, the present invention may provide an electronic part including the column spacer.

The LCD, the OLED display, etc., may include elements known to a person skilled in the art except for the column spacer according to the present invention. That is, the LCD, the OLED display, etc., in which the column spacer of the present invention may be employed, may be included in the present invention.

MODE FOR THE INVENTION

Hereinafter, the present invention is explained in detail with reference to the following examples. The examples are intended to further illustrate the present invention without limiting its scope.

Preparation Example 1: Preparation of Copolymer

To a 500 mL, round-bottomed flask equipped with a refluxing condenser and a stirrer, 100 g of a monomer mixture having the component ratio of 51 mole % of N-phenylmaleimide, 4 mole % of styrene, 10 mole % of 4-hydroxybutylacrylate glycidyl ether, and 35 mole % of methacrylic acid, 300 g of PGMEA as a solvent, and 2 g of 2,2'-azobis(2,4-dimethylvaleronitrile) as a radical polymerization initiator were added. Then, the reaction temperature was increased to 70° C. and the reaction mixture was stirred for 5 hours to obtain a copolymer having the solid content of 31 wt %. The copolymer thus prepared had an acid value of 100 mgKOH/g and a polystyrene-referenced weight average molecular weight (Mw) measured by gel permeation chromatography of 20,000.

Preparation Example 2: Compound Derived from Epoxy Resin Compound Having Cardo Backbone Structure

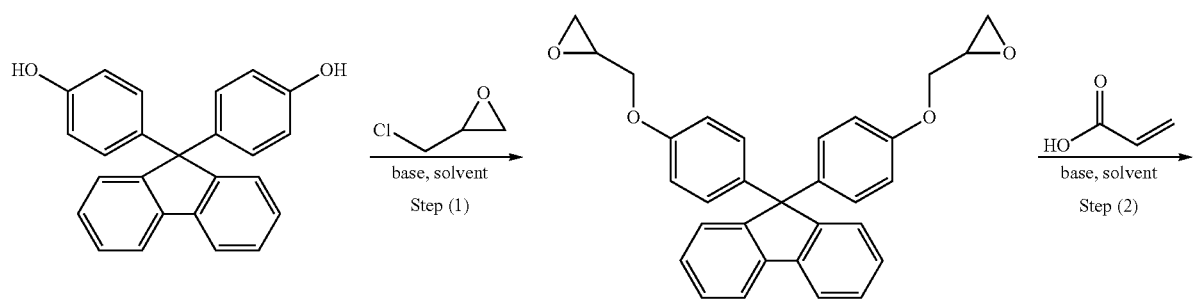

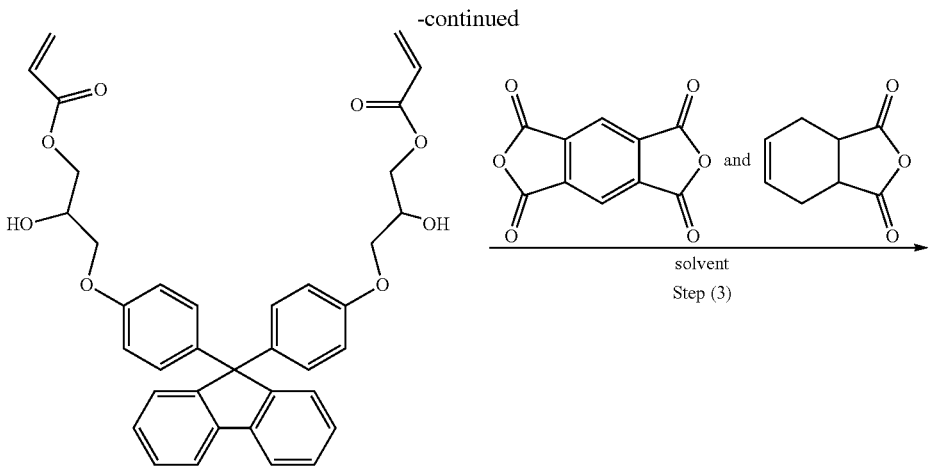

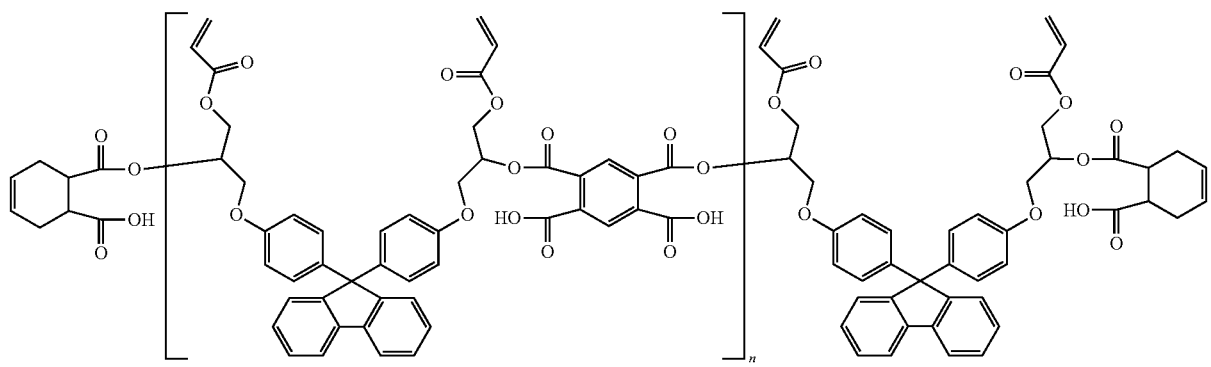

Step (1): Preparation of 9,9-bis[4-(glycidyloxy)phenyl]fluorene

To a 3,000 mL three-neck round-bottom flask, 200 g of toluene, 125.4 g of 4,4'-(9-fluorenylidene)diphenol and 78.6 g of epichlorohydrin were added, and heated to 40° C. with stirring to obtain a solution. 0.1386 g of t-butylammonium bromide and a 50% NaOH aqueous solution (3 eq) were mixed in a vessel and the mixture was slowly added to the resulting solution with stirring.

The reaction mixture thus obtained was heated to 90° C. for 1 hour to remove 4,4'-(9-fluorenylidene)diphenol completely, which was confirmed by HPLC or TLC. The reaction mixture was cooled to 30° C., and 400 mL of dichloromethane and 300 mL of 1N HCl were added thereto with stirring. Then, the organic layer was separated, washed with 300 mL of distilled water twice or three times, dried over magnesium sulfate, and distilled under a reduced pressure to remove dichloromethane. The resultant was recrystallized using a mixture of dichloromethane and methanol to obtain the title compound, an epoxy resin compound.

Step (2): Preparation of (((9H-fluorene-9,9-diyl)bis(4,1-phenylene))bis(oxy))bis(2-hydroxypropane-3,1-diyl) diacrylate (CAS No. 143182-97-2)

To a 1,000 mL three-neck flask, 115 g of the compound obtained in step (1), 50 mg of tetramethylammonium chloride, 50 mg of 2,6-bis(1,1-dimethylethyl)-4-methylphenol and 35 g of acrylic acid were added. The mixture was heated to 90-100° C. while blowing air at a flow rate of 25 mL/min and further heated to 120° C. to obtain a solution. The resulting solution was stirred for about 12 hours until its acid value dropped to less than 1.0 mg KOH/g and then cooled to room temperature. 300 mL of dichloromethane and 300 mL of distilled water were added to the reaction mixture with stirring. Then, the organic layer was separated, washed with 300 mL of distilled water twice or three times, dried over magnesium sulfate, and distilled under a reduced pressure to remove dichloromethane, thereby providing the title compound.

Step (3): Preparation of a Compound Derived from an Epoxy Resin Compound Having a Cardo Backbone Structure The compound obtained in step (2) in PGMEA was placed into a 1,000 mL three-neck flask, and 1,2,4,5-benzenetetracarboxylic dianhydride (0.75 eq), 1,2,3,6-tetrahydrophthalic anhydride (0.5 eq) and triphenylphosphine (0.01 eq) were further added thereto. The reaction mixture was heated to 120-130° C. for 2 hours with stirring and then cooled to 80-90° C., followed by stirring for 6 hours. After cooling to room temperature, a solution (solid content of 49 wt %) of polymer having a weight average molecular weight (Mw) of 6,000 and an acid value of 107 mg KOH/g (based on the solid content) was obtained.

Preparation Example 3: Preparation of Colored Dispersion 8 g of the copolymer obtained in Preparation Example 1 above, 8 g of a polymer dispersing agent (DISPERBYK-2000, BYK Co.), 12 g of carbon black, 53 g of lactam black (Black 582, BASF Co.) as an organic black, 16 g of C.I. Pigment Blue 15:6, and 384 g of PGMEA as a solvent were dispersed at room temperature for 6 hours using a paint shaker. This dispersing step was performed with 0.3 mm zirconia beads. Upon completion of the dispersing step, the beads were separated from the dispersion using a filter, thereby producing a colored dispersion having a solid content of 23 wt %.

Preparation Example 4: Preparation of Photosensitive Resin Composition 7.7 g of the copolymer obtained in Preparation Example 1, 7.5 g of the compound derived from the epoxy resin compound having a cardo backbone structure and obtained in Preparation Example 2, 4.3 g of dipentaerythritol hexaacrylate (DPHA, Nippon Kayaku Co.) as a polymerizable compound, 0.22 g of an oxime photoinitiator (N-1919, ADEKA Co.) and 0.19 g of a triazine photoinitiator (T-Y, PHARMASYNTEHSE Co.) as photopolymerization initiators, 0.009 g of a surfactant (BYK-307, BYK Co.), and 36.0 g of the colored dispersion prepared in Preparation Example 3 were mixed in 44 g of a PGMEA solvent, followed by mixing and stirring for 5 hours according to an ordinary method to obtain a photosensitive resin composition.

Example 1: Manufacture of Black Column Spacer

The photosensitive resin composition obtained in Preparation Example 4 was coated on a glass substrate using a spin coater and then pre-baked at 80° C. for 150 seconds to form a coated film. The coated film thus obtained was exposed to, using a mask for a column spacer as shown in FIG. 1, to light of a wavelength of 365 nm with the exposure intensity of 40 mJ/cm$^2$ and the exposure gap of proximity 200 μm (see FIG. 3). The mask has a circular shape (1) as the first pattern. The light transmittance of the first pattern was 100%, the light transmittance of the second pattern (2) was 20%, and the light transmittance of the third pattern (3) was 0%. The width (diameter) of the first pattern was 14 μm, and the width (X) of the third pattern (3) was 2 μm.

After verifying break point (BP) time, the exposed film was additionally developed with a diluted aqueous solution with 0.04 wt % of potassium hydroxide at 23° C. for 15 seconds, and washed with pure water for 1 minute. The pattern thus formed was post-baked in an oven at 230° C. for 30 minutes to obtain a black column spacer.

Examples 2 to 10: Manufacture of Black Column Spacer

Black column spacers were manufactured by conducting the same procedure described in Example 1 with the exception that the exposure method, the mask pattern shape for a column spacer, and the pattern width were used as shown in Table 1 below.

TABLE 1

| | | First pattern (1) (spacer part) | | | Second pattern (2) (matrix part) | Third pattern (3) (light shielding region) | |
|---|---|---|---|---|---|---|---|
| | Exposure method | Pattern shape | Size | Light transmittance | Light transmittance | Width (X) | Light transmittance |
| Example 1 | Proximity 200 μm | Circle | 14 μm | 100% | 20% | 2 μm | 0% |
| Example 2 | Proximity 200 μm | Circle | 14 μm | 100% | 20% | 4 μm | 0% |
| Example 3 | Proximity 200 μm | Square | 14 μm | 100% | 20% | 4 μm | 0% |
| Example 4 | Proximity 100 μm | Circle | 14 μm | 100% | 20% | 4 μm | 0% |
| Example 5 | Proximity 200 μm | Circle | 14 μm | 100% | 20% | 6 μm | 0% |
| Example 6 | Proximity 200 μm | Square | 14 μm | 100% | 20% | 6 μm | 0% |
| Example 7 | Proximity 200 μm | Circle | 14 μm | 100% | 20% | 8 μm | 0% |
| Example 8 | Proximity 200 μm | Square | 14 μm | 100% | 20% | 8 μm | 0% |
| Example 9 | Proximity 200 μm | Circle | 14 μm | 100% | 20% | 10 μm | 0% |
| Example 10 | Proximity 200 μm | Square | 14 μm | 100% | 20% | 10 μm | 0% |

Reference Example 1: Manufacture of Black Column Spacer

A black column spacer (see (a) of FIG. 4) was manufactured by conducting the same procedure described in Example 1 with the exception that a mask which does not include a third pattern was used, and the third pattern was replaced with the second pattern (see (b) of FIG. 4).

Experimental Example 1: Taper Angle of Column Spacer Part

Black column spacers of Examples 1 to 10 and Reference Example 1 (see FIG. 5) were manufactured, and the taper angle of a column spacer part was measured using a height difference measuring device (SIS-2000, SNU Precision) and a scanning electron microscope (SEM) (S-4300, Hitachi Co.). The taper angle was defined by the taper angles of the upper position (a part corresponding to 90% of the thickness of the column spacer (A-B)) and the bottom position (a part corresponding to 10% of the thickness of the column spacer (A-B)) on the basis of the thickness of the column spacer (A-B). The taper angle of the column spacer was measured after development and after baking. In this case, the higher the taper angle of the column spacer part is, higher resolution of the black column spacer may be expected to be achieved.

Experimental Example 2: Film Thickness

Black column spacers of Examples 1 to 10 and Reference Example 1 (see FIG. 5) were manufactured, and the thickness of the column spacer (A), the thickness of the black matrix part (B), and the thickness of the light shielding region (C) were measured using a height difference measuring device (SIS-2000, SNU Precision). In this case, if the thickness of the black matrix part (B) is the level of 2.0±0.5 µm, good light shielding properties may be expected.

The measured results are summarized as shown in Table 2 below.

TABLE 2

|  | Taper angle of column spacer part (°) | | Thickness of column spacer part (A) (µm) | Thickness of black matrix part (B) (µm) | Height difference (B − C) (µm) |
| --- | --- | --- | --- | --- | --- |
|  | After development | After curing | | | |
| Example 1 | 12.5 | 11 | 3.1 | 2.05 | 0.02 |
| Example 2 | 16.6 | 14 | 3.09 | 2.08 | 0.14 |
| Example 3 | 15 | 12 | 3.08 | 2.05 | 0.12 |
| Example 4 | 43.4 | 27.3 | 3.11 | 2.04 | 0.91 |
| Example 5 | 24.4 | 17.8 | 3.11 | 2.06 | 0.41 |
| Example 6 | 22.9 | 18.4 | 3.09 | 1.98 | 0.37 |
| Example 7 | 29.06 | 18.4 | 3.1 | 2.01 | 0.93 |
| Example 8 | 30 | 19 | 3.1 | 2.06 | 0.92 |
| Example 9 | 32.8 | 26.5 | 3.09 | 2.05 | 1.82 |
| Example 10 | 41.9 | 30.1 | 3.1 | 1.97 | 1.72 |
| Reference Example 1 | 9.5 | 8.5 | 3.11 | 2.01 | Unmeasurable |

As shown in Table 2, the taper angles of the column spacers according to Examples 1 to 10 were definitely greater than that of Reference Example 1, and fine patterns were readily formed in Examples 1 to 10. In this case, as the width (X) of the third pattern (light shielding region) increased, the height difference (B-C) of the column spacer part increased.

The invention claimed is:

1. A mask for a column spacer, the mask comprising:
    (a) a first pattern;
    (b) a second pattern positioned adjacent to the first pattern and having lower light transmittance than the first pattern; and
    (c) a third pattern positioned at a boundary between the first pattern and the second pattern and having lower light transmittance than the second pattern,
    wherein the width of the third pattern is 14 to 60% of a width of the first pattern.

2. The mask of claim 1, wherein the light transmittance of the second pattern is 15 to 25% of the light transmittance of the first pattern, and the light transmittance of the third pattern is 0 to 25% of the light transmittance of the second pattern.

3. The mask of claim 1, wherein, in the whole area of the mask, the first pattern forms at least one closed region, the third pattern forms a border region surrounding the closed region of the first pattern, and the second pattern forms the remaining region other than the first pattern and the third pattern.

* * * * *